(12) United States Patent
Kim et al.

(10) Patent No.: US 11,456,273 B2
(45) Date of Patent: Sep. 27, 2022

(54) BONDING HEAD AND A BONDING APPARATUS HAVING THE SAME

(71) Applicant: SAMSUNG ELECTRONICS CO., LTD., Suwon-si (KR)

(72) Inventors: Jaecheol Kim, Suwon-si (KR); Gilman Kang, Suwon-si (KR); Yongdae Ha, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 323 days.

(21) Appl. No.: 16/682,840

(22) Filed: Nov. 13, 2019

(65) Prior Publication Data
US 2020/0343215 A1    Oct. 29, 2020

(30) Foreign Application Priority Data

Apr. 29, 2019  (KR) .................. 10-2019-0050044

(51) Int. Cl.
| | | |
|---|---|---|
| B23K 20/00 | (2006.01) | |
| H01L 23/00 | (2006.01) | |
| B23K 20/02 | (2006.01) | |
| B23K 101/40 | (2006.01) | |

(52) U.S. Cl.
CPC ............ *H01L 24/75* (2013.01); *B23K 20/025* (2013.01); *B23K 2101/40* (2018.08); *H01L 2224/75305* (2013.01); *H01L 2224/75312* (2013.01)

(58) Field of Classification Search
CPC .. B23K 1/0016; B23K 2101/40; B23K 1/008; B23K 20/023; B23K 20/16; B23K 3/0471; B23K 3/0623
See application file for complete search history.

(56) References Cited

U.S. PATENT DOCUMENTS

| | | | | |
|---|---|---|---|---|
| 5,810,959 A | * | 9/1998 | Tanaka | B29C 66/91921 156/275.5 |
| 6,264,089 B1 | * | 7/2001 | Hasegawa | F24F 1/0067 228/5.5 |
| 6,498,051 B1 | * | 12/2002 | Watanabe | H05K 3/323 438/106 |

(Continued)

FOREIGN PATENT DOCUMENTS

| | | |
|---|---|---|
| JP | 1996-124972 | 5/1996 |
| JP | 2012-199358 | 10/2012 |

(Continued)

OTHER PUBLICATIONS

WO2016031806A1 computer english translation (Year: 2022).*

*Primary Examiner* — Erin B Saad
(74) *Attorney, Agent, or Firm* — F. Chau & Associates, LLC

(57) ABSTRACT

A bonding head for performing a thermal compression process including a base body. A bonding heater is disposed on the base body that generates a melting heat. A bonding tool is disposed on the bonding heater that compresses a bonding object against a bonding base while transferring the melting heat to the bonding object to thereby bond the bonding object to the bonding base by the thermal compression process. A heat controller is disposed at the bonding tool, and a thermal conductivity of the heat controller is less than a thermal conductivity of the bonding tool.

11 Claims, 5 Drawing Sheets

(56) References Cited

U.S. PATENT DOCUMENTS

| | | | |
|---|---|---|---|
| 6,940,053 B2* | 9/2005 | Shi | B23K 1/0016 |
| | | | 219/548 |
| 7,736,950 B2* | 6/2010 | Pendse | H01L 24/81 |
| | | | 438/108 |
| 8,062,926 B2* | 11/2011 | Kobayashi | H01L 21/56 |
| | | | 438/108 |
| 9,431,366 B2* | 8/2016 | Interrante | H01L 21/563 |
| 2006/0118598 A1* | 6/2006 | Chikamori | B23K 20/023 |
| | | | 228/42 |
| 2013/0210194 A1* | 8/2013 | Bibi | H01L 24/95 |
| | | | 438/107 |
| 2014/0175159 A1* | 6/2014 | Kostner | H01L 24/75 |
| | | | 228/102 |
| 2014/0376148 A1* | 12/2014 | Sasaki | H01L 21/6831 |
| | | | 361/234 |
| 2015/0060527 A1* | 3/2015 | Tang | H01L 24/75 |
| | | | 228/180.22 |
| 2018/0366434 A1* | 12/2018 | McClain | H01L 24/32 |

FOREIGN PATENT DOCUMENTS

| | | |
|---|---|---|
| JP | 2013-098264 | 5/2013 |
| WO | WO 2016/031806 | 3/2016 |

\* cited by examiner

BONDING HEAD AND A BONDING APPARATUS HAVING THE SAME

CROSS-REFERENCE TO RELATED APPLICATION

This non-provisional patent application claims priority under 35 U.S.C. § 119 to Korean Patent Application No. 10-2019-0050044 filed on Apr. 29, 2019 in the Korean Intellectual Property Office, the disclosure of which is incorporated by reference herein in its entirety.

TECHNICAL FIELD

The present disclosure relates to a bonding head and a bonding apparatus having the same.

DISCUSSION OF THE RELATED ART

As recent electronic appliances including various semiconductor devices have been designed to be increasingly light weight and compact, the semiconductor packages used therein have become more highly integrated and smaller in size. Thus, a chip stack package in which multiple layers of integrated circuitry are vertically stacked has been widely used for increasing the chip density in a small sized package.

In general, the chips and the circuit board of the chip stack package are interconnected by an overall interconnection, such as a bump structure and a penetration electrode, not by a peripheral interconnection such as a lead frame and a wire bonding structure. Thus, the number of the connection pins can be increased and the size of the circuit board can be reduced in the chip stack package. As a result, the chip density and the operational reliability of the chip stack package are remarkably increased as compared with the conventional semiconductor packages.

A bonding of the chip to a chip or die to die in a wafer level package process may be performed by a thermal compression process. A second chip is mounted on a first chip and the second chip is compressed onto to the first chip by a bonding tool while heat is transferred to a bump structure of the second chip to melt the bumps. However, the temperature of the bonding tool is not uniform throughout the bonding tool. Thus, the heat transfer to the bump structure from the bonding tool is not uniform, and a temperature deviation may occur between the central bump structure and the peripheral bump structure of the chip. The temperature deviation usually gives rise to insufficient melting of the peripheral bump structures, and as a result, bonding failures frequently occur between the first chip and the second chip.

SUMMARY

According to an exemplary embodiment of the present inventive concept, a bonding head for performing a thermal compression process including a base body. A bonding heater is disposed on the base body that generates a melting heat. A bonding tool is disposed on the bonding heater that compresses a bonding object against a bonding base while transferring the melting heat to the bonding object to thereby bond the bonding object to the bonding base by the thermal compression process. A heat controller is disposed at the bonding tool, and a thermal conductivity of the heat controller is less than a thermal conductivity of the bonding tool.

According to an exemplary embodiment of the present inventive concept, a bonding apparatus is provided including a substrate holder to which a first chip is secured. The first chip includes a plurality of contact pads. A bonding head is configured to apply thermal compression to a second chip having a plurality of bonding units and that is mounted on the first chip. The bonding head includes a base body, a bonding heater disposed on the base body that generates a melting heat, a bonding tool disposed on the bonding heater that compresses the second chip against the first chip while transferring a melting heat to the second chip to thereby bond the second chip to the first chip, and a heat controller disposed in the bonding tool. The heat controller has a lower thermal conductivity than a thermal conductivity of the bonding tool.

BRIEF DESCRIPTION OF THE DRAWINGS

The above described and other features of the present inventive concept will become more apparent by describing in detail exemplary embodiments thereof with reference to the accompanying drawings, in which.

DETAILED DESCRIPTION OF THE EMBODIMENTS

Exemplary embodiments of the present invention will now be described with reference to the accompanying drawings. The present invention may, however, be embodied in many different forms and should not be construed as being limited to the embodiments set forth herein.

Figure 1:
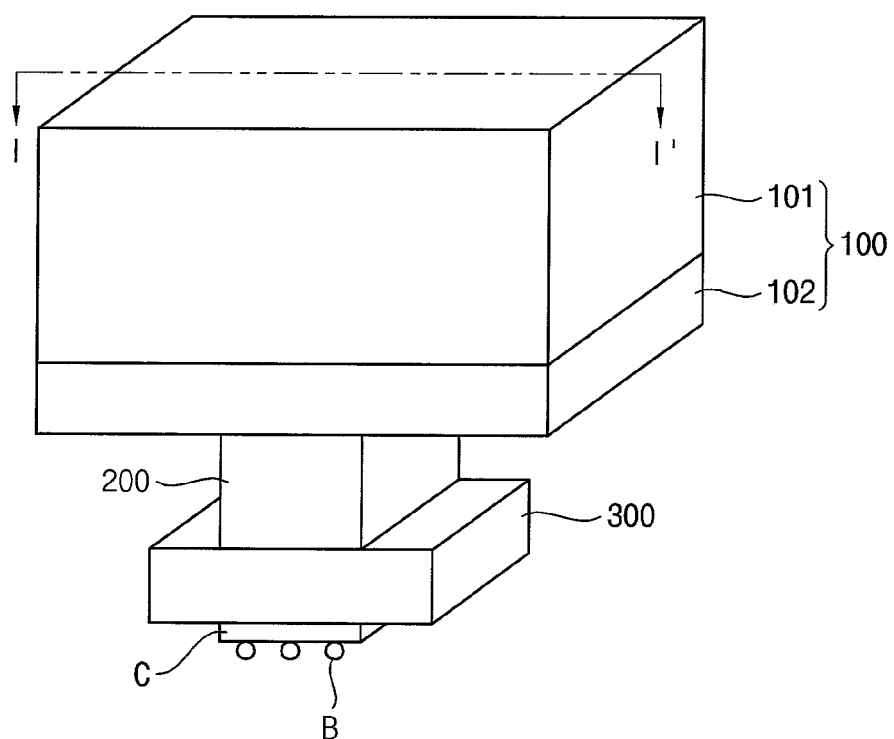
FIG. 1 is a perspective view illustrating a bonding head used in a thermal compression process in accordance with an example embodiment of the present inventive concept.
Figure 2:
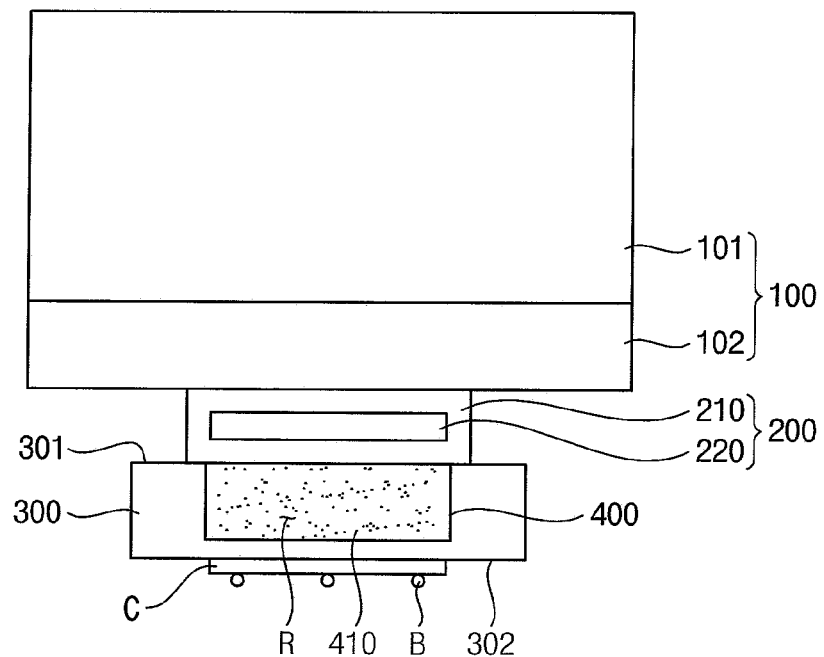
FIG. 2 is a cross-sectional view cut along a line I-I' of the bonding head in FIG. 1 in accordance with an example embodiment of the present inventive concept.

FIG. 1 is a perspective view illustrating a bonding head for a thermal compression process in accordance with an example embodiment of the present inventive concept. FIG. 2 is a cross-sectional view cut along a line I-I' of the bonding head in FIG. 1 according to an example embodiment of the present inventive concept.

Referring to FIGS. 1 and 2, a bonding head 500 for a thermal compression in accordance with an example embodiment of the present inventive concept may include a base body 100, a bonding heater 200 arranged on the base body 100 that generates a melting heat, a bonding tool 300 arranged on the bonding heater 200 that compresses a bonding object C to a bonding base w bile transferring the melting heat to the bonding object C to thereby bond the bonding object C to the bonding base by the thermal compression, and a heat controller 400 controlling a temperature of the bonding tool 300 such that the temperature distribution of the bonding tool 300 may be uniform.

For example, the base body 100 may include a metallic upper block 101 and a lower block 102. The lower block 102 may be a material having a low thermal conductivity. As an example, the lower block 102 may include a ceramic such as aluminum oxide ($Al_2O_3$). The thermal conductivity of lower block 102 may be lower than a thermal conductivity of the bonding heater 200, thus the heat from the bonding heater 200 may be prevented from diffusing to the upper block 101.

The base body 100 may further include a buffer block interposed between the upper block 101 and the lower block 102. A thermal conductivity of the buffer block may be smaller than or equal to the thermal conductivity of the lower block 102, so that the buffer block may prevent the heat transfer between the upper block 101 and the lower block 102.

The base body 100 may be connected to a driver and a power source and may be controlled to move toward the bonding object C to the bonding base by the driver. An electric power may be applied to the bonding heater 200 and the melting heat may be generated prior to the movement of the base body 100. However, the present inventive concept is not limited thereto. For example, the bonding heater 200 may be configured to generate the melting heat from a gas. In addition, a coolant may be further provided with the base body 100 for better bonding quality. Thus, when a bonding unit B of the bonding object C is melted and bonded to the bonding base by cooling the melted bonding unit B, the coolant may quickly cool the melted bonding unit B by the coolant.

An adsorption line may be further provided through the base body 100. Thus the bonding object may be adsorbed to the bonding tool 300 by the adsorption line to which a vacuum pressure may be applied. In such a case, the bonding head 500 may function as a chip-picking-up device and the picking up of the chip and the chip bonding may be conducted by the bonding head 500.

The bonding heater 200 may be secured to the lower block 102, and may include an insulation body 210 and a heat generator 220 at least partially enclosed by the insulation body 210.

The insulation body 210 may include a ceramic material, such as aluminum nitride (AlN), having proper insulation characteristics and thermal conductivity in such a configuration that the heat generated from the heat generator 220 may transfer to the bonding tool 300 together with minimal heat loss to the environment and the base body 100. For example, the heat generated from the heat generator 220 may be transferred to the bonding object C and may melt the bonding units B of the bonding object C for the bonding of the bonding object C to the bonding base. Thus, the heat generated from the heat generator 220 may be referred to as melting heat for melting the bonding unit B of the bonding object C.

The heat generator 220 may include an electric heater for generating a Joule heat in proportion to an electric power input. In the present example embodiment of the present inventive concept, the heat generator 220 may include a planar heat electrode layer comprising a nickel based alloy. Since the melting heat may be uniformly generated from the surface of the planar heat electrode layer, a uniform heat may be transferred to the bonding tool 300 from the bonding heater 200.

For example, the heat electrode layer may be formed into a thin layer structure, so an overall thickness of the bonding heater 200 may be reduced as compared with the conventional electric coil heater. In addition, the thickness reduction of the bonding heater 200 may increase the rapid transfer of heat to the bonding object C. Accordingly, the bonding unit B of the bonding object C may be rapidly melted in the thermal compression process.

For example, the bonding object C may include a mount chip that may be mounted on a base chip in a chip stack package process or a wafer level package process and the bonding unit B may include a bump structure such as a micro bump of the mount chip.

The bonding tool 300 may be secured to the bonding heater 200 and may compress the bonding object C to the bonding base while transferring the melting heat to the bonding object C.

For example, the bonding tool 300 may include a three dimensional shape having a first face 301 making contact with the bonding heater 200 and a second face 302 making contact with the bonding object C. In the present example embodiment of the present inventive concept, the bonding tool 300 may be shaped into a cylinder or a hexahedron according to the configuration of the bonding object C. For example, the bonding tool 300 may contact the bonding heater 200 in such a configuration that a center point of the bonding tool 300 may coincide with that of the bonding heater 200. For example, the heat controller 400 may have a width that substantially corresponds to a width of the heat generator 220 and a width of the bonding object C in a cross-sectional view. However, the present inventive concept is not limited thereto. For example, the width of the heat controller 400 may be larger than the width of an associated bonding object C, or may be narrower than the width of the bonding heater 200. The heat controller 400 may overlap each of the heat generator 220 and the bonding object C in a thickness direction (e.g., a direction perpendicular to a planar surface of the bonding object C).

The bonding tool 300 may be secured to the bonding heater 200 by various securing members. For example, a securing pressure line may extend up to the bonding tool 300 through the bonding heater 200 and a securing pressure may be applied to the bonding tool 300 via the securing pressure line. According to an exemplary embodiment of the present inventive concept, a mechanical securing member, such as a bolt, may secure the bonding tool 300 to the bonding heater 200. In such a case, the bonding tool 300 may be detachably secured to the bonding heater 200 and thus may facilitate the exchange of various bonding tools 300.

For example, when the bonding head 500 may function as a chip-picking-up device, the adsorption line may penetrate through the bonding tool 300, and the bonding object C may be adsorbed to the bonding tool 300 by the vacuum pressure that may be applied to the adsorption line. In such a case, the bonding tool 300, to which the bonding object C may be secured, may move toward the bonding base.

In the present example embodiment of the present inventive concept, the bonding object C may be mounted on the bonding base at one surface and the bonding tool 300 at another surface (e.g., an opposite surface to the bonding base mounting surface) and the bonding tool 300 may move downwards to the bonding base according to an external driving force that may be applied to the base body 100. Thus, the bonding object C may be mechanically compressed to the bonding base.

When the bonding tool 300 may make contact with the bonding object C, the melting heat generated from the bonding heater 200 may be transferred to the bonding unit B of the bonding object C via the bonding tool 300 and a plurality of the bonding units B may be melted by the melting heat. Thus, the bonding units B of the bonding object C may be mechanically compressed to the bonding base in a melting state. The bonding object C and the bonding base may be in contact with each other by the melted bonding units B, to thereby form a preliminary bonding structure of the bonding object C and the bonding base. Thereafter, a cooling process may be performed on the preliminary bonding structure and the melted bonding units B may thus be solidified together with the bonding base. Accordingly, the bonding object C may be bonded to the bonding base with high reliability by the thermal compression process.

For example, the bonding tool 300 may include a sufficient thermal conductivity for the heat transfer from the bonding heater 200 to the bonding unit B and a sufficient rigidity for enduring the external driving force. For example, the bonding tool 300 may comprise a stainless steel and/or a ceramic such as silicon carbide (SiC) having a relatively high thermal conductivity. Thus, the melting heat may be effectively transferred to the bonding object C via the bonding tool 300.

As the bonding units B may be uniformly distributed on a whole surface of the bonding object C, the melting heat needs to be uniformly transferred to the bonding object C. For example, melting heat needs to be uniformly applied to a peripheral portion and a central portion of the bonding object C. Thus, the melting heat need be uniformly transferred to the bonding tool 300 from the bonding heater 200.

However, the heat flux of the melting heat may radially decrease from the central portion of the bonding tool 300 to the peripheral portion of the bonding tool 300, because the bonding heater 200 may make contact with the central portion of the bonding tool 300. Thus, the central portion of the bonding tool 300 may have a large heat flux when heated by the bonding heater 200, and the tool temperature of the bonding tool 300 may gradually decrease toward the peripheral portion from the central portion. For example, a temperature deviation may occur between the peripheral portion and the central portion of the bonding tool 300.

The heat controller 400 may be provided in the bonding tool 300. The heat controller 400 may minimize the temperature deviation of the bonding tool 300.

For example, some of the first face 301 of the bonding tool 300 may be recessed toward the second face 302 of the bonding tool 300 at the central portion of the bonding tool 300. For example, a cavity may be formed within the first face 301 of the bonding tool 300 that extends to wards the second face 302 with sides perpendicular to the second face 302 of the bonding tool 300. The recess R may be a size smaller than a size of the bonding heater 200. For example, the recess R may be a narrower width than a width of the bonding heater 200. The recess R may be provided in the first face 301 of the bonding tool 300 to a depth smaller than the thickness of the bonding tool 300. Thus, a bottom of the recess may be spaced apart from the second face 302 and no recess may be provided on the second face 302. For example, the heat controller 400 may have a decreased thickness in a region corresponding to the eventual position of the bonding object C, and the lower surface of the heat controller 400 may be substantially parallel to the second face 302 of the bonding tool 300. The side walls of the bonding tool 300 orthogonally extending from the first face 301 to the second face 302 may be thicker than the portion of the second face 302 of the bonding tool 300 that overlaps the bonding object C.

The bonding heater 200 may be disposed on the central portion of the bonding tool 300 (e.g., in contact therewith) and the recess R may be positioned at the central portion of the bonding tool 300 with the smaller size than the size of the bonding heater 200. The bonding heater 200 may make contact with the first face 301 of the bonding tool 300 around the recess R.

The heat controller 400 may be disposed within the recess R. For example, the heat controller 400 may have a shape that substantially corresponds to an interior shape of the recess R. When the heat controller 400 having a thermal conductivity smaller than the thermal conductivity of the bonding tool 300 is arranged within the recess R, the heat flow of the melting heat to the central portion of the bonding tool 300 may be decreased.

The heat flow of the melting heat to the peripheral portion of the bonding tool 300 may be relatively strong. Thus, the heat controller may function as a thermal resistor in the recess R of the bonding tool 300.

For example, the recess R may be filled with any gas (e.g., air) and an air gap 410 may be provided at the central portion of the bonding tool 300 as the heat controller 400. Thus, when the melting heat may be transferred to the bonding tool 300 from the bonding heater 200, a large amount of the melting heat may flow to the peripheral portion of the bonding tool 300 in addition to the central portion thereof.

Therefore, as the melting heat may flow to the peripheral portion of the bonding tool 300, the heat flux deviation of the melting heat may be minimized between the central portion and the peripheral portion of the bonding tool 300, thereby decreasing the temperature deviation within the bonding tool 300 throughout an interface with the bonding object C.

Accordingly, the bonding units B of the bonding object C may be uniformly melted from a central portion to a peripheral portion of the bonding object C, and the bonding defect between the bonding object C and the bonding base may be prevented when conducting the thermal compression process by using the bonding head 500 according to exemplary embodiment of the present inventive concept.

The chip scale package process and wafer level package process may be conducted by an individual chip-to-chip (C2C) or an individual die-to-die (D2D) bonding process. Thus, it is difficult to discover a bonding defect of the chip scale package and/or the wafer level package because the bonding process may be performed on each individual chip within the chip scale package and/or the wafer level package. For that reason, the bonding defect of the bonding process may have a great effect on an overall efficiency of the chip stack package process or the wafer level package process. The bonding head 500 may increase the temperature uniformity of the bonding tool 300 and may minimize or prevent the bonding defect of each pair of chips, to thereby remark ably increase an overall efficiency of the package process for manufacturing the chip scale package and the wafer level package.

The heat controller 400 may be variously modified according to the configurations and structures of the bonding head 500.

Figure 3:
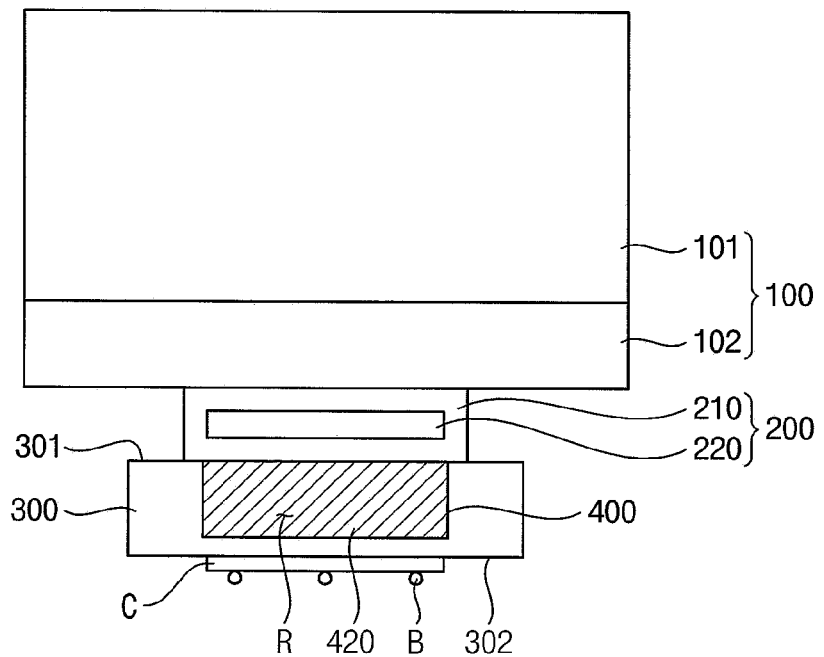
FIG. 3 is a cross-sectional view illustrating a heat controller of the bonding head show n in FIG. 2 in accordance with an example embodiment of the present inventive concept.

FIG. 3 is a cross-sectional view illustrating a heat controller of the bonding head 500 shown in FIG. 2 according to an exemplary embodiment of the present inventive concept.

Referring to FIG. 3, a heat controller 400, according to the present exemplary embodiment of the present inventive concept, may include an adiabatic member 420 disposed in the recess R and having a thermal conductivity smaller than the thermal conductivity of the bonding tool 300. Thus, a large amount of the melting heat may flow to the peripheral portion of the bonding tool 300 rather than the central portion thereof, similar to the gas gap 410 in the recess R. Therefore, the heat flux deviation of the melting heat may be minimized between the central portion of the bonding tool 300 and the peripheral portion of the bonding tool 300, thereby increasing the temperature deviation of the bonding tool 300.

For example, the bonding tool 300 may include a metal and/or a ceramic having a large thermal conductivity, and the adiabatic member 420 may have a thermal conductivity corresponding to about 0.2 to about 0.6 times the thermal conductivity of the bonding tool 300. When the thermal conductivity of the adiabatic member 420 is less than about 0.2 times the thermal conductivity of the bonding tool 300, the heat flow of the central portion of the bonding tool 300 may be substantially smaller than that of the peripheral portion of the bonding tool 300 to such a degree that the temperature of the central portion of the bonding tool 300 may be much smaller than a temperature of the peripheral portion of the bonding tool 300, and the bonding defect may frequently occur at the central portion of the bonding object C.

In contrast, when the thermal conductivity of the adiabatic member 420 is greater than about 0.6 times the thermal conductivity of the bonding tool 300, the heat flow of the central port ion of the bonding tool 300 may be substantially the same as that of the peripheral portion of the bonding tool 300 and the temperature deviation of the bonding tool 300 might not decrease between the peripheral portion and the central portion of the bonding tool 300 in such a way that the bonding defect may still occur at the peripheral portion of the bonding object C. Accordingly, the adiabatic member 420 may have a thermal conductivity corresponding to about 0.2 to about 0.6 times the thermal conductivity of the bonding tool 300.

In the present example embodiment of the present inventive concept, the bonding tool 300 may comprise silicon carbide (SiC) and the adiabatic member 420 may comprise yttrium oxide ($Y_2O_3$). However, the bonding tool 300 and the adiabatic member 420 may comprise various other materials as long as the adiabatic member 420 has a thermal conductivity that is between 0.2 to 0.6 times the thermal conductivity of the bonding tool 300. For example, the adiabatic member may fully fill the recess R. A top surface of the adiabatic member 420 may be coplanar with the first face 301 of the bonding tool 300 and the bonding heater 200 may make contact with both of the first face 301 of the bonding tool 300 and the adiabatic member 420.

Figure 4:
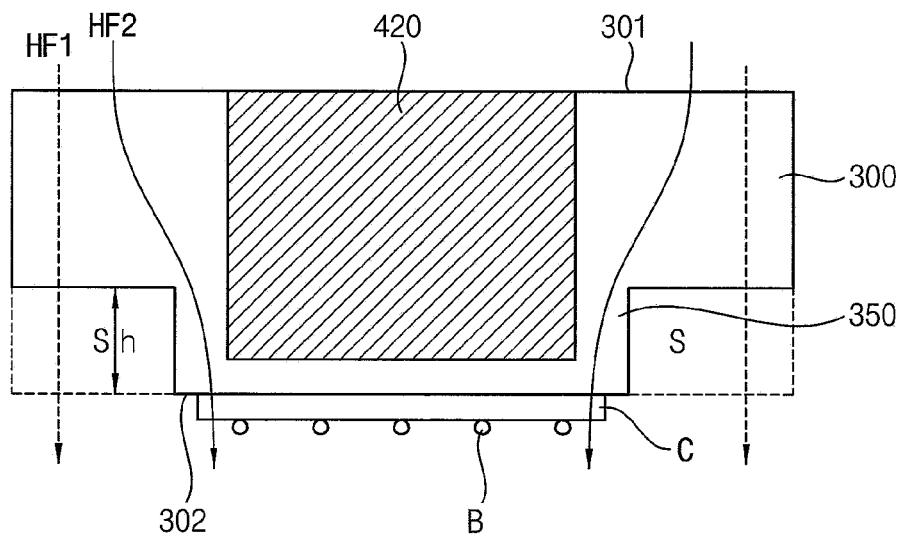
FIG. 4 is a cross-sectional view illustrating a modified version of the bonding tool shown in FIG. 3 in accordance with an example embodiment of the present inventive concept.

FIG. 4 is a cross-sectional view illustrating a modification of the bonding tool 300 shown in FIG. 3 in accordance with an example embodiment of the present inventive concept.

Referring to FIG. 4, the bonding tool 300 tool may include a protruding portion 350 protruding from the second face 302 at the central portion and to which the bonding object C may be secured in such a configuration that the heat controller 400 may extend to an inside of the protruding portion 350.

For example, peripheral bottom portions of the bonding tool 300 may be recessed from the second face 302 of the bonding tool 300 to a recess depth. Space S may be provided at the peripheral bottom portions of the bonding tool 300. A central bottom portion of the bonding tool 300 may protrude from a plane of the peripheral bottom portions to a protruding height h substantially identical to the recess depth, thereby forming the protruding portion 350 at the bottom of the central portion of the bonding tool 300. Thus, the protruding portion 350 may be arranged at the central bottom of the bonding tool 300 and may be overlapped by the peripheral spaces S.

The recess R may be expanded such that the bottom of the recess R may be close to the second face 302 of the bonding tool 300 of the protruding portion 350. Thus, the adiabatic member 420 may be arranged close to the protruding portion 350. The adiabatic member 420 may have a narrower width in a cross-sectional view relative to the width of the bonding object C. For example, the adiabatic member 420 might not overlap peripheral regions of the bonding object C, and the peripheral regions of the bonding object C may instead be overlapped by edges of the protruding portion 350 and form a step therebetween.

The melting heat transferred to the first face 301 of the bonding tool 300 may be force d to flow to the protruding portion 350 due to the adiabatic effect of air in the peripheral space S. When no protruding portion 350 is provided with the bonding tool 300, the melting heat may flow downwards along a first heat flow HF1. In contrast, when the protruding portion 350 is provided with the bonding tool 300, the melting heat may flow downwards along a second heat flow HF2 that may be biased toward the protruding portion 350, because air in the peripheral space S may have a thermal conductivity greater than the thermal conductivity of the bonding tool 300. Thus the melting heat may be prevented from flowing to the peripheral space S. For example, the melting heat may be focused to the protruding portion 350 of the bonding tool 300.

When the melting heat may flow along the first heat flow HF1, heat loss necessarily occurs at the peripheral bottom portions of the bonding tool 300 because the bonding object C may contact the central portion of the bonding tool 300. Thus the bonding object C is not in contact with the peripheral portion of the bonding tool 300. In contrast, when the melting heat may flow along the second heat flow HF2, the heat loss at the peripheral bottom portion of the bonding tool 300 may be forced to flow into the protruding portion 350 to which the bonding object C may be secured by the air in the peripheral space S. Thus, the heat flux may increase at the peripheral portion of the bonding object C just by modifying the shape of the bonding tool 300 and thus the temperature uniformity of the bonding object C may be increased by the shape modification of the bonding tool 300.

According to the present example embodiment of the present inventive concept, the melting heat may be conducted to the peripheral portions of the bonding object C by the adiabatic member 420. The air in the peripheral spaces S at the peripheral bottoms of the bonding tool 300 helps retain the heat focus to the peripheral portions of the bonding object C.

Figure 5:
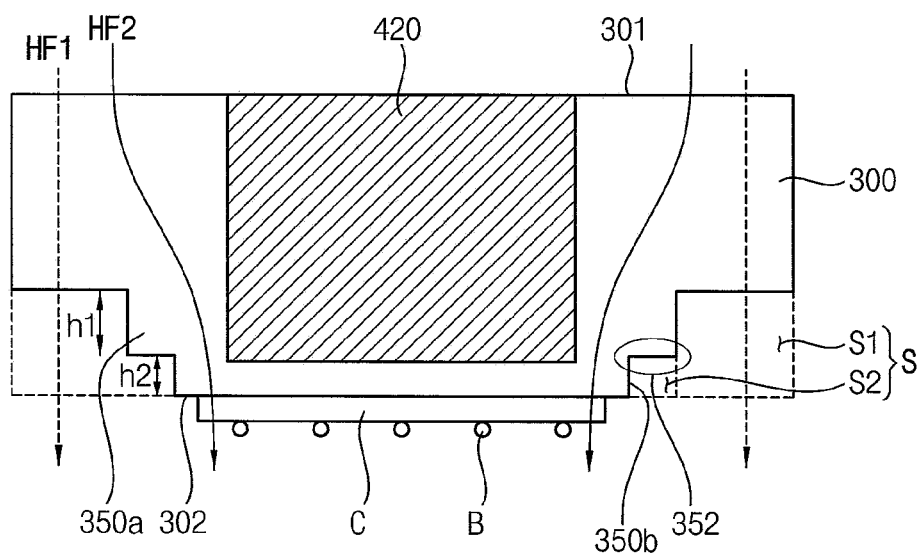
FIG. 5 is a cross-sectional view illustrating a modified version of the bonding tool shown in FIG. 3 in accordance with an example embodiment of the present inventive concept.

FIG. 5 is a cross-sectional view illustrating a modified version of the bonding tool shown in FIG. 3 in accordance with an example embodiment of the present inventive concept. In FIG. 5, the modified bonding tool 300 may have substantially the same structures as the modified bonding tool except for a step 352 at an edge portion of the protruding portion 350.

Referring to FIG. 5, the modified bonding tool 300 may include at least a step 352 extending from an edge portion of the protruding portion 350 to a peripheral portion of the bonding tool 300 in such a configuration that the protruding height h may decrease in a direction from the peripheral portion to the central portion of the bonding tool 300.

For example, the peripheral bottom portion of the bonding tool 300 may be sequentially y recessed from the second face 302 at different recess depths, thereby forming the step 352 at an edge portion of the protruding portion 350. A first recess may be formed at the peripheral portion of the bonding tool 300 to a first recess depth. A first peripheral space S1 may be provided at the peripheral bottom portion of the bonding tool 300 by the first recess depth. Thus, a central bottom portion of the bonding tool 300 may be protruded to a first protruding height h1 substantially identical to the first recess depth, thereby forming a first protruding portion 350a at the bottom of the bonding tool 300.

A second recess may be formed at an edge portion of the first protruding portion 350a to a second recess depth. The first protruding portion 350a, except for the edge portion, may be further protruded a second protruding height h2 substantially identical to the second recess depth, thereby forming a second protruding portion 350b at the bottom of the bonding tool 300.

A second peripheral space S2 may be provided at the edge portion of the first protruding portion 350a. Thus, the overall protruding portion 350 may include the first protruding portion 350a and the second protruding portion 350b that may be stepped from each other by the step 352. The protruding height h may include the first protruding height h1 and the second protruding height h2 smaller than the first protruding height h1 and may decrease from the peripheral portion to the central portion of the bonding tool 300. The peripheral space S enclosing the protruding portion 350 may also include a first space S1 enclosing the first protruding portion 350a and a second space S2 enclosing the second protruding portion 350b.

The step 352 may increase the efficiency of the heat transfer from the bonding tool 300 to the bonding object C.

When heat flows in the bonding tool 300 having no step 352, as shown in FIG. 4, the melting heat may be conducted to air adjacent to a side of the protruding portion 350 along the protruding height h. For example, the heat loss may uniformly occur at both the upper portion and the lower portion of the peripheral space S.

In contrast, when heat flows in the bonding tool 300 having the step 352, the melting heat may conduct to air at a side of the first protruding portion 350a along the first protruding height h1 and at a side of the second protruding portion 350b along the second protruding height h2. That is, a relatively larger heat loss may occur at the first peripheral space S1 and a relatively smaller heat loss may occur at the second peripheral space S2 that may be closer to the bonding object C than the first peripheral space S1.

The air in the first peripheral space S1 may interact with ambient air and the air in the second peripheral space S2 may interact with the air in the first peripheral space S1. The second peripheral space S2 may be smaller than the first peripheral space S1, thus the air temperature in the second peripheral space S2 may be higher than the air temperature in the first peripheral space S1. Thus, the heat loss to the second peripheral space S2 may be much lower than the heat loss to the first peripheral space S1, and thus the temperature of the edge portion of the bonding object C may be much more uniform when the step 352 may be provided with the bonding tool 300 than when no step may be provided with the bonding tool 300.

According to the present example embodiment of the inventive concept, the step 352 may be provided with the bonding tool 300 in which the adiabatic member 420 is arranged at the central portion. However, the step 352 may also be provided with the bonding tool 300 in which the air gap 410 is arranged at the central portion, as shown in FIG. 2.

Figure 6:
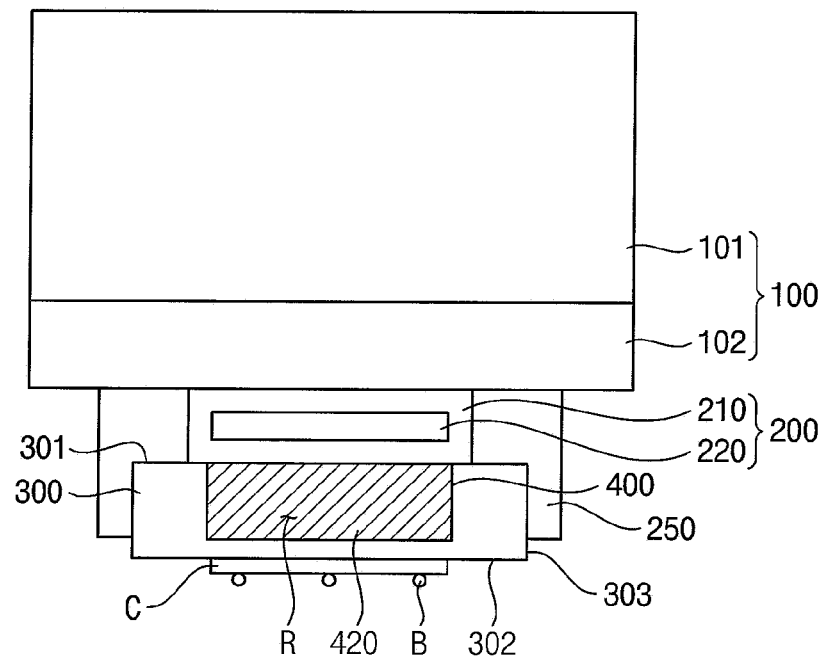
FIG. 6 is a cross-sectional view illustrating a modified version of the bonding head shown in FIG. 3 in accordance with an example embodiment of the present inventive concept.

FIG. 6 is a cross-sectional view illustrating a modified version of the bonding head shown in FIG. 3. In FIG. 6, the modified version of the bonding head 501 may have substantially the same structures as the bonding head 500 shown in FIG. 3, except for a subsidiary heater for heating a side surface 303 of the bonding tool 300. Thus, in FIG. 6, the same reference numerals may be used to denote the same elements of FIG. 3, and any further detailed descriptions of the same elements will be omitted hereinafter for brevity.

Referring to FIG. 6, a modified bonding head 501 may include a subsidiary heater 250 enclosing a side surface 303 of the bonding tool 300. A subsidiary melting heat may be generate d from the subsidiary heater 250 and may be transferred to the bonding object C from the side surface 303 of the bonding tool 300. For example, an additional heat to the melting heat may be transferred to the bonding units B of the bonding object C from the side surface 303 of the bonding tool 300.

The melting heat may be transferred downwardly to the second face 302 from the first face 301, and heat loss may occur at the side surface 303 of the bonding tool 300 when the melting heat is transferred. Most of the temperature deviation between the peripheral portion of the bonding tool 300 and the central portion of the bonding tool 300 may be caused by the heat loss from the side surface 303.

Thus, the subsidiary heater 250 may be arranged partially or wholly on the side surface 303 of the bonding tool 300 and may transfer the subsidiary heat to the side surface 303. Therefore, the subsidiary heat may compensate for the heat loss of the melting heat from the side surface 303. In addition, the subsidiary heater 250 may overlap side surfaces of the bonding heater 200 and a surface of the base body 100 opposite to the first face 301 of the bonding tool 300 (e.g., the lower block 102).

The subsidiary heat may be transferred to the side surface 303 in such a way that the peripheral portion of the bonding tool 300 may have substantially the same temperature as the central portion of the bonding tool 300. The heat flux of the central portion and the peripheral portion may be detected and the subsidiary heat may be controlled to generate the subsidiary heat for compensating for the heat flux difference between the peripheral portion and the central portion of the bonding tool 300.

For example, the subsidiary heater 250 may include an electric heater at least partially enclosing the side surface 303 of the bonding tool 300. Thus, an electric power may be applied to the subsidiary heater 250 and a Joule heat may be generated from the subsidiary heater 250 as the subsidiary heat. However, the present inventive concept is not limited thereto. For example, the subsidiary heater 250 may be heated by a gas.

The contact area between the side surface 303 and the subsidiary heater 250 may be determined by a required amount of the subsidiary heat and the efficiency of the heat transfer at the side surface 303.

For example, the subsidiary heater 250 may enclose a peripheral portion of the first face 301 that might not be in contact with the bonding heater 200. In such a case, both of the melting heat and the subsidiary heat may be transferred to the bonding tool 300 through the first face 301, and thus the temperature uniformity of the bonding tool 300 may be increased and the melting time of the bonding unit B may be shortened.

Figure 7:
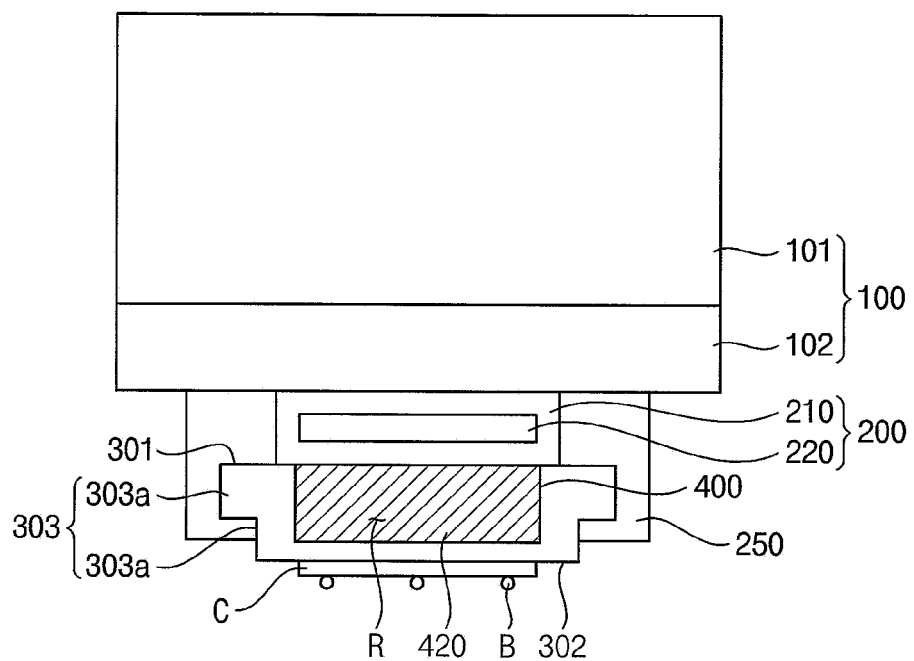
FIG. 7 is a cross-sectional view illustrating a modified version of the bonding head shown in FIG. 3 in accordance with an example embodiment of the present inventive concept.

FIG. 7 is a cross-sectional view illustrating a modified version of the bonding head shown in FIG. 3. In FIG. 7, the modified bonding head 502 may have substantially the same structures as the first modified bonding head 501 shown in FIG. 6, except that the bonding tool 300 according to the present exemplary embodiment of the inventive concept may have the protruding portion 350 shown in FIG. 4. Thus, in FIG. 7, the same reference numerals may denote the same elements as described and shown in reference to FIGS. 4 and 6, and any further detailed descriptions on the same elements will be omitted hereinafter for brevity.

Referring to FIG. 7, a modified bonding head 502 may include the protruding portion 350 protruding from the bottom of the bonding tool 300 in such a configuration that an upper side surface 303a of the bonding tool 300 and a lower side surface 303b of the bonding tool 300 may be covered by the subsidiary heater 250. Due to the recess of the peripheral portion of the bonding tool 300, the lower portion of the side surface 303 of the bonding tool 300 may be formed into a side surface 303b of the protruding portion 350. Thus, the side surface 303 of the bonding tool 300 may include an upper side surface 303a and the lower side surface 303b.

The melting heat may be transferred to the bonding tool 300 at the first face 301 and may flow to the bonding object C along the second heat flow path HF2 in the bonding tool 300 due to the air in the peripheral space S.

When the melting heat flows in the bonding tool 300, the heat loss may occur from the lower side surface 303b defining the peripheral space S as well as the upper side surface 303a.

For example, because the lower side surface 303b may be closer to the bonding object C, the heat loss from the lower side surface 303b may have a greater effect on the temperature variation at the edge portion of the bonding object C than the upper side surface 303a. Thus, the heat loss at the lower side surface 303b may be the primary cause for the bonding defect.

For those reasons, the lower side surface 303b may also be at least partially covered by the subsidiary heater 250, and the heat loss from the lower side surface 303b may be minimize d or prevented when conducting the thermal compression process.

The subsidiary heater 250 may have the same structures as the subsidiary heater 250 shown in FIG. 6, and any detailed descriptions on the subsidiary heater 250 will be omitted for brevity. The contact area between the lower side surface 303b and the subsidiary heater 250 may be determined by a required amount of the subsidiary heat and the efficiency of the heat transfer at the lower side surface 303b.

In addition, the subsidiary heater 250 may also enclose a peripheral portion of the first face 301 that might not be in contact with the bonding heater 200. Thus, both the melting heat and the subsidiary heat may be transferred to the bonding tool 300 through the first face 301. Therefore, the temperature uniformity of the bonding tool 300 may be increased and the melting time of the bonding unit B may be shortened.

For example, the protruding portion 350 of the bonding tool 300 may also include the step 352 as described in detail with reference to FIG. 4, and thus the temperature variation at the edge portion of the bonding object C may be more efficiently controlled.

Further, the adiabatic member 420 in the bonding tool 300 may also be replaced with the air gap 410, as described in detail with reference to FIG. 2.

According to the present example embodiment of the bonding head 500, the heat controller 400 having a thermal conductivity smaller than that of the bonding tool 300 may be arranged in the bonding tool 300 and the subsidiary heater 250 may be arranged at the side surface of the bonding tool 300 for compensating for the heat loss incurred by the bonding tool 300.

The heat controller 400 may be arranged at the central portion of the bonding tool 300 and may control the heat flux of the melting heat. The melting heat for melting the bonding units B of the bonding object C is thus controlled in such a way that the heat flux of the peripheral portion of the bonding tool 300 may be greater than the heat flux of the central portion of the bonding tool 300 to compensate for the heat loss from the side surface 303 of the bonding tool 300. Thus, the temperature uniformity may be increased in the bonding tool 300. For example, the subsidiary heater 250 for enclosing the side surface 303 of the bonding tool 300 may be selectively provided with the bonding head 500 for compensating for the heat loss from the side surface 303 of the bonding tool 300.

The temperature uniformity of the bonding tool 300 may make the temperature of the bonding object C uniform along a whole surface of the bonding object C, thereby reducing the bonding defects incurred during the thermal compression process.

Figure 8:
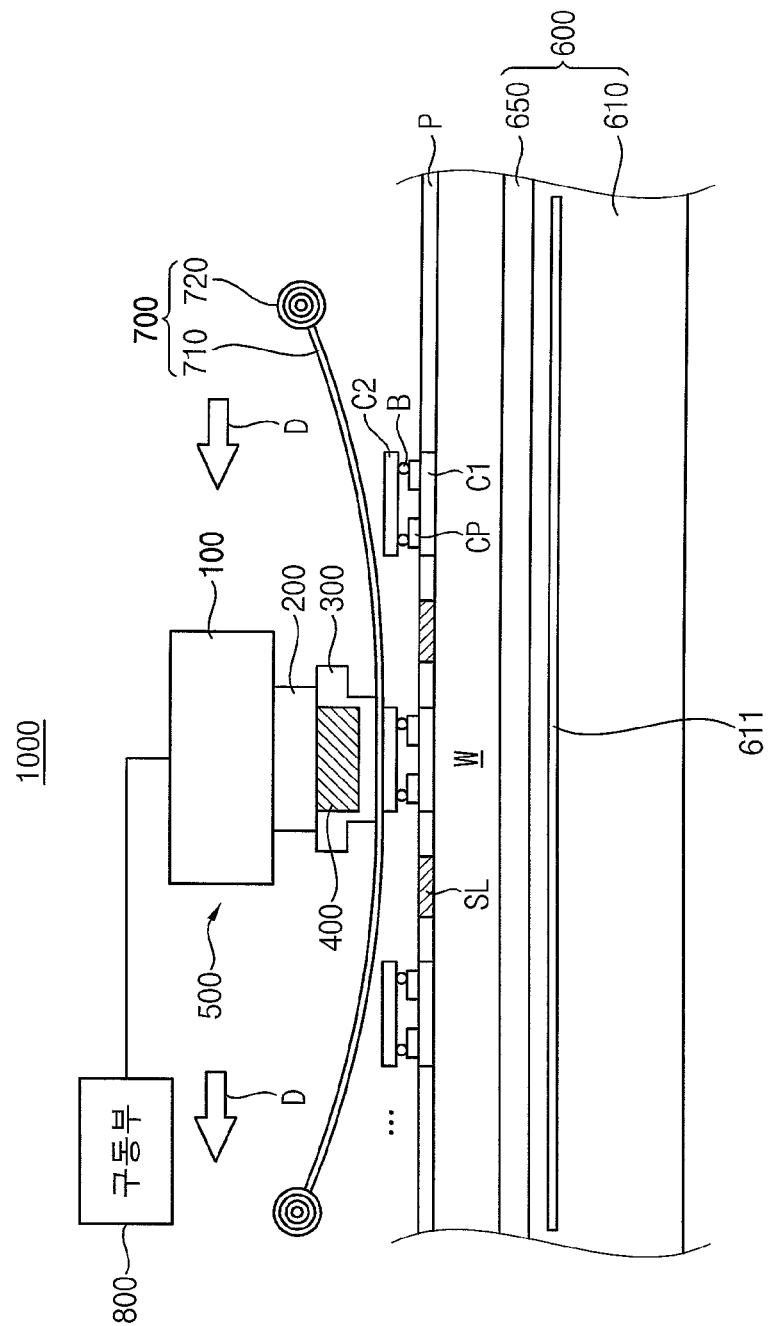
FIG. 8 is a structural view illustrating a bonding apparatus in accordance with an example embodiment of the present inventive concept.

FIG. 8 is a structural view illustrating a bonding apparatus in accordance with an example embodiment of the present inventive concept.

Referring to FIG. 8, a bonding apparatus 1000 in accordance with an example embodiment may include a substrate holder 600 to which a first chip C1 may be secured such that a plurality of contact pads CP may be arranged on the first chip C1, and a bonding head 500 moving along a bonding direction (e.g., a D direction) step-by-step over the substrate holder 600 and compressing a second chip C2 having a plurality of bonding units B and mounted on the first chip C1 such that each of the bonding units B may be melted and bonded to a respective one of the contact pads CP, to thereby bond the second chip C2 to the first chip C1 by a thermal compression process. A head separator 700 for separating the bonding head 500 from the second chip C2 and a driver 800 (e.g., a motor connected to a computer interface) for driving the bonding head 500 may be further provided with the bonding apparatus 1000.

In the present example embodiment of the present inventive concept, the bonding head 500 may include a base body 100, a bonding heater 200 arranged on the base body 100 and generating a melting heat, a bonding tool arranged on the boding heater 200 and compressing the second chip C2 to the first chip C1 while transferring the melting heat to the second chip C2 to thereby bond the second chip C2 to the first chip C1 by the thermal compression process, and a heat controller 400 for controlling a temperature of the bonding tool such that the temperature distribution of the bonding tool is uniform.

For example, the first chip C1 may include a semiconductor device that may be manufactured by a series of semiconductor manufacturing processes. For example, the first chip C1 may be provided on a wafer W for a chip stack package process or a wafer level package process. Thus, the first chip C1 may include a preliminary diced chip that may be temporarily diced from the wafer W and an undiced chip that may be integrally provided with the wafer W.

In the present example embodiment of the present inventive concept, the first chip C1 may be the undiced chip that may be arranged on a single wafer W and a plurality of the contact pads CP may be exposed upwards through a passivation layer P covering an uppermost surface of the wafer W.

The substrate holder 600 may be arranged at a bottom of a bonding chamber of the bonding apparatus 1000 and the wafer W including the first chip C1 may be secured to the substrate holder 600. For example, the substrate holder 600 may include an electrostatic chuck to which the wafer is secured by an electrostatic force. The electrostatic chuck may include a heating plate 610 having a chuck heater 611 for heating the wafer W at a preheating temperature smaller than a temperature of the melting heat, and a chuck plate 650 combined to the heating plate 610 and securing the wafer W.

The heating plate 610 may be shaped into a disk, for example, and the chuck heater 611 may be installed in the chuck plate 650. The chuck heater 611 may be provided as an electrode pattern. The electrode pattern may generate a Joule heat in accordance with an external electronic power. However, the present invention is not limited thereto. For example, the chuck heater 611 may be supplied with heat generated by a gas.

The chuck heater 611 may heat the wafer W to a preheating temperature smaller than a temperature of the melting heat before initiating the bonding process of the second chip C2 to the first chip C1. Thus, when the bonding process may be initiated and the bonding head 500 make s contact with the second chip C2, the heat in the bonding head 500 can flow downwardly to the wafer W due to the temperature gradient between the bonding head 500 and the wafer W. Thus, the temperature gradient may be set for the heat flow from the bonding generator 200 to the bonding units B of the second chip C2 in the bonding apparatus 1000. For example, the chuck heater 611 may heat the wafer W to the preheating temperature of about 100° C. to about 150° C.

The chuck plate 650 may also be shaped into a disk, for example, and may be arranged on the heating plate 610. The wafer W may be loaded onto the chuck plate 650. The wafer W may be secured to the chuck plate 650 by a vacuum pressure that may be applied to the wafer W by a plurality of vacuum lines.

The heating plate 610 may generate the preheating heat and the chuck plate 650 may transfer the preheating heat to the wafer W. Thus, the first chip C1 may be heated by the chuck heater 611 to the preheating temperature of about 100° C. to about 150° C.

The second chip C2 may be mounted on the first chip C1 in such a configuration that a plurality of the bonding units B may be aligned with a plurality of the contact pads CP, respectively.

For example, a micro bump may be provided on a rear surface of the second chip C2 a s the bonding unit B and the second chip C2 may be picked up and mounted on the first chip C1 chip-by-chip by using a picker assembly. Thus, the second chip C2 may be mounted on the first chip C1 in such a way that the micro bump of the second chip C2 may make contact with the contact pad CP of the corresponding first chip C1.

Then, the bonding head 500 may be arranged over the wafer W for compressing the second chip C2 to the first chip C1.

The bonding head 500 may have the same structures as the bonding head 500, the modifications of the bonding head 501 and 502, and thus any detailed descriptions on the bonding head 500 will be omitted hereinafter for brevity.

The bonding head 500 may be controlled by a driver 800. The driver 800 may be connected to a control center and may drive the bonding head 500 to compress the second chip C2 to the first chip C1 and/or to move along the bonding direction D step-by-step in response to a bonding signal which may refer to a manual or computer generated input.

A head separator 700 may be provided with the bonding apparatus 1000 for separating the bonding head 500 from the second chip C2 after the second chip C2 is bonded to the first chip C by the thermal compression process.

For example, the head separator 700 may include a separation strap 710 extending in the bonding direction (e.g., the D direction) and may be interposed between the bonding tool 300 and the second chip C2 when the second chip C2 is compressed to the first chip C1. A fixed roller 720 is positioned at opposite portions of the separation strap 710 along the bonding direction (e.g., the D direction) such that the separation strap 710 may be rolled up around a roller and may be loosed from another roller to thereby move the separation strap 710 in the bonding direction (e.g., the D direction). For example, the separation strap 710 may include a teflon foil.

When the thermal compression bonding process is initiated, the melting heat may be generated from the bonding heater 200 of the bonding head 500. For example, the melting heat may be generated at a temperature of about 150° C. to about 300° C. The bonding head 500 may move downwardly simultaneously with the generation melting heat and may make contact with the second chip C2.

The separation strap 710 may extend in the bonding direction (e.g., the D direction) from an end portion to another end portion of the wafer W and may be interposed between the second chip C2 and the bonding tool 300.

The melting heat may be transferred to the second chip C2 via the bonding tool 300 and the bonding unit B of the second chip C2 may be melted while compressing to the first chip C1 by an external driving force from the driver 800. Thus, the bonding unit B of the second chip C2 may be mechanically compressed to the contact pad CP of the first chip C1 in a melted state. Then, the melted bonding unit B contact with the contact pad CP may be cooled by a coolant, and the bonding unit B may be bonded to the contact pad CP with high reliability. For example, the second chip C2 may be bonded to the first chip C by the thermal compression process.

When the bonding of the second chip C2 to the first chip C1 is completed, the bonding head 500 may move upwardly by the driver 800. Because, the separation strap 710 may be interposed between the bonding tool 300 and the second chip C2, the bonding tool 300 may be easily separated from the second chip C2.

Thereafter, the bonding head 500 may move along the bonding direction (e.g., the D direction) and may be ready to perform the bonding process with respect to the next chip neighboring the second chip C2.

When conducting the thermal compression process between the second chip C2 and the first chip C1, the temperature of the bonding tool 300 may be controlled to be uniform by the heat controller 400 and the subsidiary heater 250. Thus, the bonding unit B of the second chip C2 may be uniformly melted along a whole surface of the second chip C2, thereby preventing the non-uniform melting of the bonding unit B and reducing the bonding defects between the bonding unit B of the second chip C2 and the contact pad CP of the first chip C1.

According to the present example embodiment, the second chip C2 is mounted by a chip picking device, such as a picker assembly of a chip mounting apparatus, and then the bonding head 500 conducts bonding process between the second chip C2 and the first chip C1 aside from the chip mounting. However, when the bonding head 500 and the chip picking device are combined with the chip picking device in a single apparatus, the mounting of the second chip C2 on the first chip C1 and the bonding of the second chip C2 to the first chip C1 may be conducted in the same chamber without any exchanges between the chip mounting apparatus including the chip picking device and the bonding head 500.

In such a case, a chip picker for picking the second chip C2 from a wafer, a chip adsorption member, such as a vacuum line, and an aligner for aligning the contact pad CP of the first chip C1 and the bonding unit B of the second chip C2 may be provided with the bonding head 500.

Accordingly, a plurality of the second chips C2 may be bonded to a plurality of the first chips C1 that may be arranged on the wafer W, respectively, by the bonding head 500, to thereby form a plurality of preliminary chip stack packages on the wafer W. Thereafter, the preliminary chip stack packages may be cut along scribe lines of the wafer W, to thereby form a plurality of chip stack packages.

While the present example embodiment of the present invention has been described in relation to the chip-to-chip bonding process that may be conducted by using the bonding head 500, the bonding head 500 may be used in any other similar bonding processes.

According to the example embodiments of the present inventive concept previously described, the temperature uniformity of the bonding tool 300 may be increased by the heat controller 400 and the subsidiary heater 250, and the uniform temperature distribution of the bonding tool may reduce the bonding defects encountered during the thermal compression bonding process. The heat controller 400 having a thermal conductivity smaller than that of the bonding tool 300 may be arranged in the bonding tool 300 and the subsidiary heater 250 may be arranged at the side surface of the bonding tool 300 for compensating for the heat loss experienced by the bonding tool 300.

The heat controller 400 may be arranged at the central portion of the bonding tool 300 and may control the heat flux of the melting heat for melting the bonding unit B of the bonding object C may be controlled in such a way that the heat flux of the peripheral portion of the bonding tool 300 may be greater than that of the central portion of the bonding tool 300 in view of the heat loss from the side surface. Thus, the temperature uniformity may be increased in the bonding tool. For example, the subsidiary heater 250 for enclosing the side surface of the bonding tool 300 may be selectively provided with the bonding head 500 for compensating for the heat loss from the side surface 303.

The temperature uniformity of the bonding tool may make the temperature of the bonding object uniform along a whole surface of the bonding object, thereby reducing or minimizing the bonding defects incurred during the thermal compression process.

While exemplary embodiments have been described with reference to the figures, it will be understood by those of ordinary skill in the art that various changes in form and details may be made therein without departing from the spirit and scope of the present invention as defined by the following claims.

What is claimed is:

1. A bonding apparatus, comprising:
a substrate holder to which a first chip is secured, the first chip including a plurality of contact pads; and
a bonding head configured to apply thermal compression to a second chip having a plurality of bonding units and mounted on the first chip;
wherein the bonding head includes:
a base body;
a bonding heater disposed on the base body and generating a melting heat;
a bonding tool disposed on the bonding heater, the bonding tool compressing the second chip against the first chip while transferring a melting heat to the second chip to thereby bond the second chip to the first chip by the thermal compression; and
a heat controller disposed in the bonding tool, wherein the heat controller has a lower thermal conductivity than a thermal conductivity of the bonding tool, and wherein the heat controller contacts the bonding tool on a bottom surface thereof and on side surfaces thereof.

2. The bonding apparatus of claim 1, wherein the bonding tool includes a first face disposed on the bonding heater, a second face disposed on the second chip, and a recess having a size smaller than a size of the bonding heater, wherein the bonding heater is disposed on the first face at the recess.

3. The bonding apparatus of claim 2, wherein the recess is filled with air, wherein the air filled recess has a thermal conductivity smaller than the thermal conductivity of the bonding tool, and is provided at a central portion of the bonding tool.

4. The bonding apparatus of claim 2, wherein the heat controller includes a member filling up the recess and having a thermal conductivity smaller than the thermal conductivity of the bonding tool, wherein the member has a top surface that is coplanar with the first face of the bonding tool, and wherein the bonding heater is in contact with both of the first face of the bonding tool and the member.

5. The bonding apparatus of claim 2, wherein a central portion of the bonding tool has a protruding portion protruding from a bottom thereof to a protruding height, and to which the first chip or the second chip is secured, and wherein the heat controller extends to an inside of the protruding portion.

6. The bonding apparatus of claim 5, wherein the protruding portion has at least one step extending from an edge portion to a peripheral portion of the bonding tool, wherein the protruding height increases in a direction from the peripheral portion to the central portion of the bonding tool.

7. A bonding apparatus, comprising:
a substrate holder to which a first chip is secured, the first chip including a plurality of contact pads; and
a bonding head configured to apply thermal compression to a second chip having a plurality of bonding units and mounted on the first chip;
wherein the bonding head includes:
a base body;
a bonding heater disposed on the base body and generating a melting heat;
a bonding tool disposed on the bonding heater, the bonding tool compressing the second chip against the first chip while transferring a melting heat to the second chip to thereby bond the second chip to the first chip by the thermal compression; and
a heat controller disposed in the bonding tool, wherein the heat controller has a lower thermal conductivity than a thermal conductivity of the bonding tool,
wherein the bonding head further includes a subsidiary heater disposed at a side surface of the bonding tool such that a subsidiary melting heat generated from the subsidiary heater is transferred to the first chip or the second chip from the side surface of the bonding tool.

8. The bonding apparatus of claim 1, further comprising a head separator for separating the bonding head from the second chip after the second chip is bonded to the first chip by the thermal compression.

9. A bonding apparatus, comprising:
   a substrate holder to which a first chip is secured, the first chip including a plurality of contact pads; and
   a bonding head configured to apply thermal compression to a second chip having a plurality of bonding units and mounted on the first chip;
   wherein the bonding head includes:
   a base body;
   a bonding heater disposed on the base body and generating a melting heat;
   a bonding tool disposed on the bonding heater, the bonding tool compressing the second chip against the first chip while transferring a melting heat to the second chip to thereby bond the second chip to the first chip by the thermal compression; and
   a heat controller disposed in the bonding tool, wherein the heat controller has a lower thermal conductivity than a thermal conductivity of the bonding tool,
   wherein the bonding apparatus further comprises a head separator far separating the bonding head from the second chip after the second chip is bonded to the first chip by the thermal compression, and
   wherein the head separator includes:
   a separation strap interposed between the bonding tool and the second chip when the second chip is compressed to the first chip; and
   fixed rollers at opposite portions of the separation strap.

10. The bonding apparatus of claim 1, wherein the first chip includes a plurality of undiced chips arranged in a single wafer and the substrate bolder includes an electrostatic chuck to which the wafer is secured by an electrostatic force.

11. The bonding apparatus of claim 10, wherein the electrostatic chuck includes:
    a heating plate having a chuck heater for heating the wafer at a temperature smaller than a temperature of the melting heat; and
    a chuck plate combined to the heating plate and securing the wafer.

* * * * *